United States Patent

Hong

[11] Patent Number: 5,349,220
[45] Date of Patent: Sep. 20, 1994

[54] FLASH MEMORY CELL AND ITS OPERATION

[75] Inventor: Gary Hong, Hsin-Chu, Taiwan

[73] Assignee: United Microelectronics Corporation, Hsin Chu, Taiwan

[21] Appl. No.: 104,010

[22] Filed: Aug. 10, 1993

[51] Int. Cl.⁵ ..................... H01L 29/68; G11C 16/04
[52] U.S. Cl. .................... 257/322; 257/316; 365/185; 365/218
[58] Field of Search ............... 257/322, 316; 365/185, 365/218

[56] References Cited

U.S. PATENT DOCUMENTS

| | | | |
|---|---|---|---|
| 4,780,424 | 10/1988 | Holler et al. | 437/29 |
| 4,853,895 | 8/1989 | Mitchell et al. | 365/185 |
| 4,998,220 | 3/1991 | Eitan et al. | 365/185 |
| 5,016,215 | 5/1991 | Tigelaar | 257/316 |
| 5,070,032 | 12/1991 | Yuan et al. | 437/43 |
| 5,077,691 | 12/1991 | Haddad et al. | 365/218 |
| 5,106,772 | 4/1992 | Lai | 437/43 |
| 5,168,465 | 12/1992 | Harari | 365/185 |
| 5,247,477 | 9/1993 | Norman | 257/322 |

OTHER PUBLICATIONS

IEEE Electron–Devices Letter, pp. 117–119 (1989), "Degradations Due to Hole Trapping in Flash Memory Cells".

"A 128K Flash EEPROM using Double-Polysilicon Technology", by Seeq, Solid State CKt, pp. 676–683 (1987).

*Primary Examiner*—Robert Limanek
*Attorney, Agent, or Firm*—George O. Saile; Graham S. Jones, II

[57] ABSTRACT

A method of operating a flash memory semiconductor device is provided. The semiconductor device formed on a substrate lightly is doped with a dopant. A source region and a drain region are formed in the substrate on the surface thereof. A dielectric layer is deposited upon the substrate. A floating gate electrode is formed on the dielectric layer proximate to at least the edges of the source region and the drain region. Additional dielectric material is deposited upon the surface of the floating gate electrode, and a gate electrode is deposited upon the surface of the additional dielectric material.

18 Claims, 2 Drawing Sheets

FLASH MEMORY CELL AND ITS OPERATION

BACKGROUND OF THE INVENTION

1. Field of the Invention

This invention relates to MOSFET semiconductor devices and more particularly to flash memory cells.

2. Description of Related Art

A flash memory cell using split gate structure, which can overcome the problem of over-erasing, was demonstrated by Seeq, Solid State Ckt, pp 676–683 (1987). However, it is known that the split gate structure, as demonstrated in the above paper has the drawback of an endurance problem, since the programming and the erasing operations are through the same drain region junction.

As shown in a publication IEEE Electron-Devices letter, pages 117–119 (March 1989) when erasing by *Fowler-Nordheim* (F-N) tunneling and programming by channel-not-electron are through the same drain region junction, the cell's programmability degradation is much worse than the erasing being separated to source junction such as U.S. Pat. No. 4,780,424, No. 4,678,787, and No. 5,106,772.

However in a split-gate structure, the source junction is not directly underneath the floating gate as it is in a conventional stacked cell structure. Therefore, no Fowler-Nordheim (F-N) tunneling through the source is feasible as illustrated by FIG. 1.

U.S. Pat. No. 5,070,032, No. 4,853,895 and No. 4,998,220 used a third layer of polysilicon over the polysilicon 1 (Floating area) as the erase gate to perform so-called polysilicon to polysilicon erasing which can avoid the operation of programming/erasing being through the same drain region junction. However, third polysilicon erasing cell structure increases cell size and the process complexity significantly. Also oxide grown over polysilicon as tunneling material suffers more of a reliability problem.

An object of this invention is to provide programming of a flash memory cell.

SUMMARY OF THE INVENTION

In accordance with this invention, a semiconductor device is formed on a substrate lightly doped with a dopant, a source region and a drain region in the substrate on the surface thereof, a dielectric layer deposited upon the substrate, a floating gate electrode formed on the dielectric layer proximate to at least the edges of the source region and the drain region, additional dielectric material deposited upon the surface of the floating gate electrode, a gate electrode deposited upon the surface of the additional dielectric material, and high voltage generator means for applying a voltage to the control gate.

Preferably, means is provided for providing programming of the device with the drain region at a relatively low voltage, the source region at an intermediate voltage, the control gate at a relatively high voltage, and a relatively negative voltage to the substrate.

Preferably, means is provided for erasing data in the device by applying a neutral to positive voltage to the drain region, a floating voltage to the source, a negative voltage to the control gate and a neutral voltage to the substrate.

Preferably, means is provided for reading data from the device by applying a small negative voltage to the drain region, a neutral voltage to the source region a positive voltage to the control gate, and a neutral voltage to the substrate.

Preferably, a programming voltage is applied to the control gate ranging between about 3 Volts and about 5 Volts at the source region, between about 12 Volts and about 14 volts at the control gate, near 0 Volts at the drain region, and between about −3 Volts and about −5 Volts at the substrate.

Preferably, means is provided for erasing data in the device by applying a voltage from a neutral value and about 5 Volts to the drain region, a floating voltage at the source region and a substantial negative voltage on the control gate, and a voltage on the substrate between about −3 Volts and about −5 Volts.

Preferably, the control gate voltage is about −10 Volts.

Preferably, means is provided for reading data in the device by applying a voltage from a neutral value and about −1 Volts to the drain region, a neutral voltage at the source region and a positive voltage at the control gate, and a neutral voltage on the substrate.

Preferably, the source region voltage is about 0 Volts.

Preferably, the control gate voltage is between about about 3 and about 5 Volts.

In accordance with this invention a method is provided for operating a flash memory cell device with a semiconductor substrate, a source, a drain a dielectric layer deposited upon the substrate, a floating gate electrode formed on the dielectric layer proximate to at least the edges of the source region and the drain region, additional dielectric material deposited upon the surface of the floating gate electrode, and a gate electrode deposited upon the surface of the additional dielectric material, the improvement comprising the step of applying a high programming voltage to the control gate during programming.

Preferably, the method provides programming of the device with the drain region at a relatively low voltage, the source region at an intermediate voltage, the control gate at a relatively high voltage, and a relatively negative voltage to the substrate.

Preferably, the method provides for erasing data in the device by applying a neutral to positive voltage to the drain region, a floating voltage to the source, a negative voltage to the control gate and a neutral voltage to the substrate.

Preferably, the method provides reading data from the device by applying a small negative voltage to the drain region, a neutral voltage to the source region a positive voltage to the control gate, and a neutral voltage to the substrate.

Preferably, the method provides the programming voltage ranges between about 3 Volts and about 5 Volts at the source region, between about 12 Volts and about 14 volts at the control gate, near 0 Volts at the drain region, and between about −3 Volts and about −5 Volts at the substrate.

Preferably, the method provides erasing data in the device by applying a voltage from a neutral value and about 5 Volts to the drain region, a floating voltage at the source region and a substantial negative voltage on the control gate, and a voltage on the substrate between about −3 Volts and about −5 Volts.

Preferably, the method provides that the control gate voltage is about −10 Volts.

Preferably, the method provides reading data in the device by applying a voltage from a neutral value and about −1 Volts to the drain region, a neutral voltage at the source region and a positive voltage at the control gate, and a neutral voltage on the substrate.

Preferably, the method provides that the source region voltage is about 0 Volts.

Preferably, the method provides that the control gate voltage is between about about 3 and about 5 Volts.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
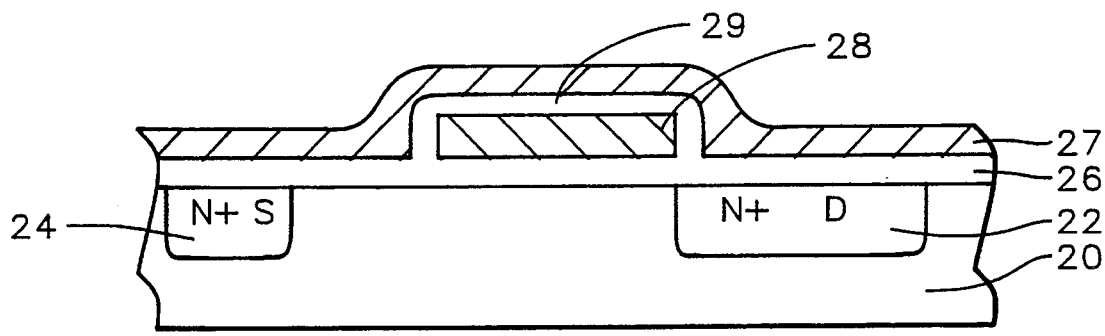
FIG. 1 shows a sectional view of a prior art type of flash memory cell.

In this invention, a flash memory cell is provided with a simple double polysilicon split-gate structure. The cell provides novel operations for programming that can improve erasing operation. A prior art cell structure is shown in FIG. 1 formed on a semiconductor substrate 20 which is lightly doped with a boron dopant. A source region 24 and a drain region 22 are formed in the substrate 20. The gate oxide layer 26 carries a floating gate 28 composed of polysilicon 1. Atop the floating gate 26 is additional oxide layer 29. The top layer is the control gate 27 composed of polysilicon 2. The source region 24 is located significantly to the left of the floating gate 29.

The erasing operation operates by Fowler-Nordheim (F-N) tunneling from the floating gate 28 to the drain region junction by applying a positive voltage, e.g. of about 12 Volts, at the drain region 22 and grounding the control gate, or by applying a negative voltage at the control gate 27 and grounding the drain region 22, as it is known in the art.

Figure 2A:
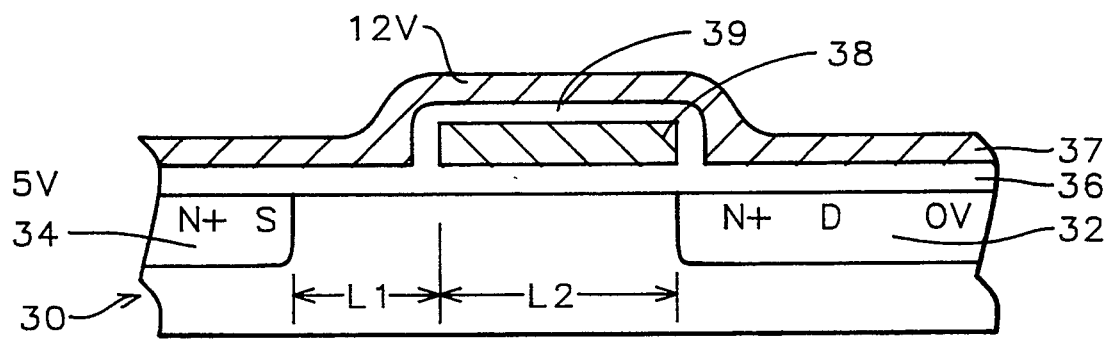
FIG. 2A shows a device similar to that in FIG. 1 with the length L1 between the end of the floating gate and the source region and the length L2 (which is the width of the floating gate 38) indicated in conjunction with FIG. 2B which is aligned with FIG. 2A.

FIG. 2A shows a semiconductor substrate 30 which is lightly doped with a boron (B) dopant. A source region 34 and a drain region 32 are formed in the substrate 30. A gate oxide layer 36 deposited upon the substrate carries a floating gate 38 composed of polysilicon 1. Formed atop the floating gate 38 is an additional dielectric layer 39, preferably composed of ONO. The top layer is the control gate layer 37 composed of a conductor such as polysilicon 2. Note that the length L1 between the end of the floating gate and the source region 34 and the length L2 (which is the width of the floating gate 38) are within the ranges of lengths, as follows:

L1 is between about 0.3 μm and about 0.7 μm.
L2 is between about 0.5 μm and about 1.0 μm.

Figure 2B:
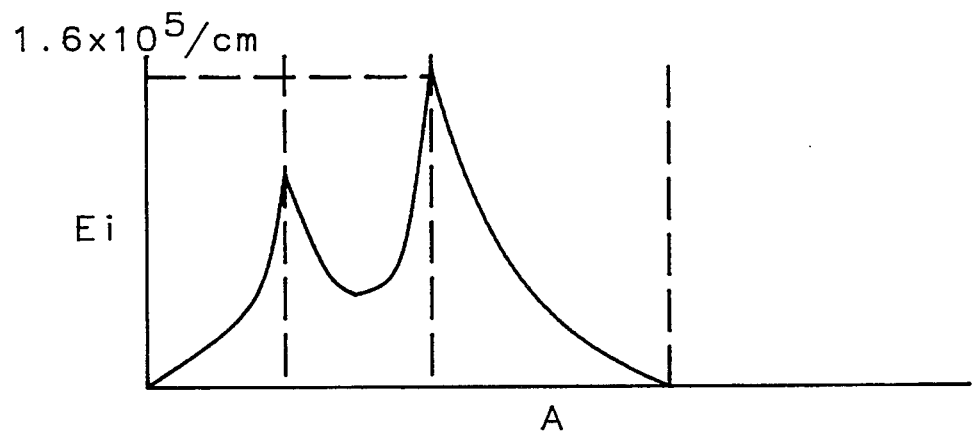
FIG. 2B is a chart of E-field along the width of the device of FIG. 2A.

Referring to FIG. 2B which is a chart of E-field along the width of the device of FIG. 2A, the programming operation is completed by applying a high positive voltage (about 12 Volts) to the control gate layer 37, applying low voltage to source region 34 (about 3 Volts) and grounding the drain region junction 32. The strongly conducting L1 channel together with the weaker conducting L2 area, produces a high lateral electric field peak at the left edge "A" of the floating gate 38. The peak E-field at the "A" position is several times larger in magnitude than the value of the E-field at drain region edges when a conventional programming method is used (i.e. 7–8 Volts at the drain region, 12 Volts at the control gate 32, with the source 34 grounded.) This high lateral E-field, plus a high vertical field, which is favorable for electron injection upward make the programmability of this arrangement much more efficient. (The high vertical field is due to a lower voltage, 3 Volts, at the source region 34). The high programmability of this programming arrangement can also be explained by the analogous programming method of source-side injection which is described by A. T. Wu in "Novel High Speed, 5-Volt Programming EPROM Structure with Source Side Injection", IEDM pp 584–587 (1986), or by D. Liu in IEDM pp 315–318 (1991.)

Figure 3:
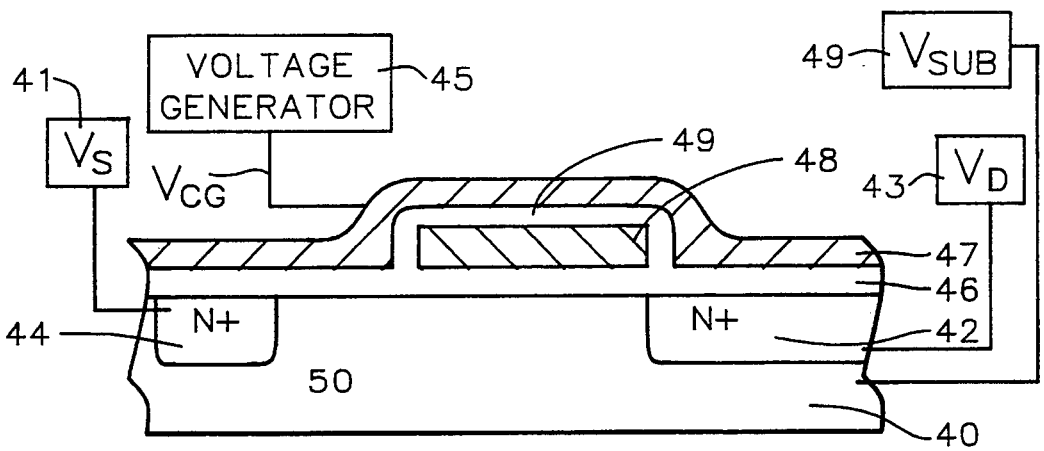
FIG. 3 shows a device similar to that in FIG. 1 with the control gate connected to a voltage generator.

FIG. 3 shows a semiconductor substrate 40 which is lightly doped with boron. A source region 44 of N+ dopant is formed in substrate 40 far to the left of floating gate 48. The substrate 40 is connected to a voltage source $V_{SUB}$ 49. The drain region 42 N+ is also formed in the substrate 40 aligned with the floating gate. The drain region 42 is connected to voltage source $V_D$ 43. The gate oxide layer 46 carries a floating gate electrode 48, preferably composed of polysilicon 1. Atop the floating gate 48 is an additional dielectric layer 49, preferably composed of ONO. The top layer is the control gate electrode 47, preferably composed of polysilicon 2. Control gate electrode 47 is connected to voltage generator 45, which supplies voltages shown in the table for program, erase, and read functions. The source region 44, connected to voltage source $V_S$ 41, is located significantly to the left of the floating gate 48.

Figure 4:
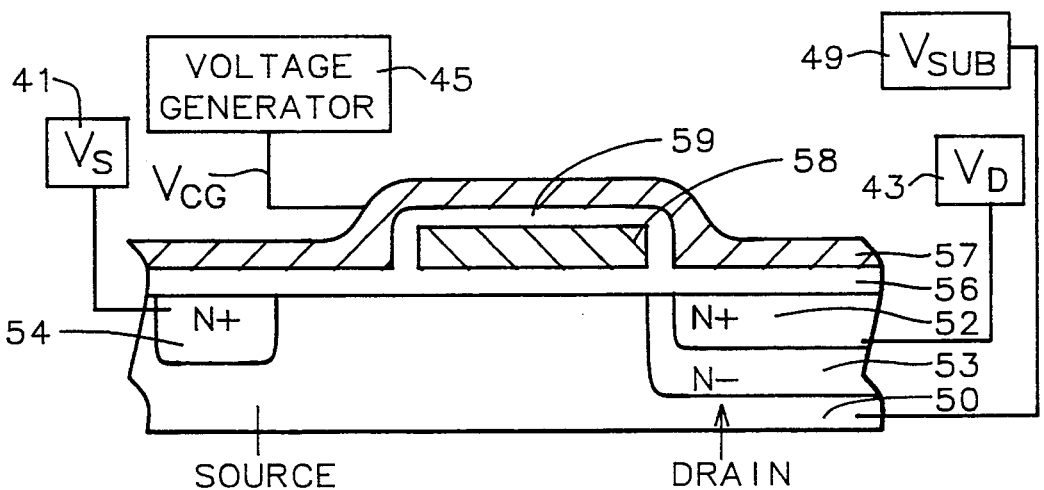
FIG. 4 shows a device similar to that in FIG. 3 with the control gate connected to a voltage generator, and a modification of the drain by an additional N- drain region.

FIG. 4 shows a semiconductor substrate 50 which is lightly doped with boron dopant. A source region 54 of N+ dopant is formed in substrate 50 far to the left of floating gate 58. The substrate 50 is connected to a voltage source $V_{SUB}$ 49. The drain regions 52 N+ and N− 53 are also formed in the substrate 50. The drain region 52 is connected to voltage source $V_D$ 43. The gate oxide layer 56 carries above it a floating gate conductor 58 composed of polysilicon 1. Atop the floating gate conductor 58 is an additional oxide 59 layer. The top layer is the control gate conductor 57, preferably composed of polysilicon 2. Control gate conductor 57 is connected to voltage generator 45, which supplies the voltages shown in the table below for program, erase, and read functions. The source region 54, connected to voltage source $V_S$ 41, is located significantly to the left of the floating gate 58. The source region 54 and drain region 52 are at about the voltages listed in the table. The drain region 52 is at about 0 Volts.

The vertical field can be increased by applying a back-bias (negative voltage) to the P− substrate or P− well depending upon the type of well which is used. The negative voltage on the P− substrate creates an electric field directed downwardly which is added to the vertical field component. The increased vertical field compensates the lower field caused lower coupling ratio because thinner gate oxide (tunneling oxide) is used for flash memory as compared with that used for EPROM devices at the floating gate, which is originally created by voltage coupling from the control gate. Therefore, the preferred operation conditions are summarized as follows:

|  | Drain | Source | Control gate | Substrate |
|---|---|---|---|---|
| Program | 0 V | 3~5 V | 12~14 V | −3~−5 V |
| Erase | 0~5 V | Floating | ~−10 V | 0 V |
| Read | ~1 V | 0 V | 3~5 V | 0 V |

*The substrate bias is −3 V to −5 V.

Referring to the Table above, the voltage on the control gate 12 to 14 Volts for programming and −10 Volts for erasing can be generated by an internal circuit (charge pumper) because the high voltage used on the control gate will not consume much current.

Referring again to FIG. 3, the source region 44 and drain region 42 are at about the voltage listed in the table for program, erase and read operations.

A voltage generator (charge pumper) circuit 45 in FIG. 3 and a voltage generator circuit 45 in FIG. 4 produce voltage with larger than usual positive and negative amplitudes for the voltage $V_{CG}$ on the control gates 47 and 57 in FIGS. 3 and 4 respectively is described by Rinerson et al in 512k EPROMS" IEEE ISSCC Dig. Tech. Pap. pp. 136–137 [Reprint pages 305-306] (1984).

A voltage generator (charge pumper) circuit for producing negative voltages is described by Kuriyama et al, "A 5 V-Only 0.6 μm Flash EPROM with Row Decoder Scheme in Triple-Well Structure", 1992 IEEE International Solid-State Circuits Conference pp. 152–153 (1992).

When the drain region voltage employed to erase is on the order of 12 Volts, the drain region junction can be a graded junction, i.e. the drain in FIG. 4 is a double diffused (DD) junction, where the drain regions 52 and 53 are provided with N- dopant implanted into the drain region.

Less than 5 Volts at the junction can be used for single voltage programming, so a single voltage power supply (5 Volts or 3 Volts) is feasible because the maximum voltages used at the source region for programming is 5 Volts or 3 Volts because the maximum voltages used at the source for programming is 5 Volts or 3 Volts. Only the programming by the channel hot electron method, which is used for this invention, needs to consume high current, which is very difficult for such a circuit to generate internally. So the 3 Volts or 5 Volts at the source junction for programming operation can be supplied by voltage source Vs 41. But if the source region or drain region needs a higher voltage (e.g. 7 Volts), then the external voltage supplies need both voltages (5 Volts or 3 Volts) and 7 Volt voltages.

Voltage generator (charge pump) circuits can provide the potentials required as described in Rinerson et al above which describes a positive charge pump (shown in FIG. 2 thereof) and Kuriyama et al above (which shows a negative charge pump in FIG. 3 thereof).

While this invention has been described in terms of the above specific embodiment(s), those skilled in the art will recognize that the invention can be practiced as modified within the spirit and scope of the appended claims. It is contemplated that changes can be made in form and detail, without departing from the spirit and scope of the present invention. Accordingly all such changes come within the purview of the present invention which encompasses the subject matter of the claims which follow.

Having thus described the invention, what is claimed as new and desirable to be secured by Letters Patent is as follows:

1. A split gate semiconductor device formed on a substrate lightly doped with a dopant, comprising
   a source region and a drain region in said substrate on the surface thereof,
   a dielectric layer deposited upon said substrate, a floating gate electrode formed on said dielectric layer proximate to at least the edge of said drain region with said source region spaced away from said floating gate structure while in proximity thereto in accordance with a split gate arrangement,
   additional dielectric material deposited upon the surface of said floating gate electrode, and a control gate electrode deposited upon the surface of said additional dielectric material, and
   high voltage generator means for applying a programming voltage to said control gate electrode,
   means for providing programming of said device with said drain region at a relatively low voltage, said source region at an intermediate positive voltage, said control gate electrode at a relatively high voltage, and said substrate at a relatively negative voltage.

2. A split gate semiconductor device formed on a substrate lightly doped with a dopant, comprising
   a source region and a drain region in said substrate on the surface thereof,
   a dielectric layer deposited upon said substrate, a floating gate electrode formed on said dielectric layer proximate to at least the edge of said drain region with said source region spaced away from said floating gate structure while in proximity thereto in accordance with a split gate arrangement,
   additional dielectric material deposited upon the surface of said floating gate electrode, and a control gate electrode deposited upon the surface of said additional dielectric material, and
   high voltage generator means for applying a programming voltage to said control gate electrode,
   means for erasing data in said device by applying a voltage ranging from a neutral voltage to a positive voltage to said drain region, applying a floating voltage to said source, applying a negative voltage to said control gate and applying a neutral voltage to said substrate.

3. A semiconductor device in accordance with claim 1 comprising means for reading data from said device by applying a small negative voltage to said drain region, applying a neutral voltage to said source region, applying a positive voltage to said control gate, and applying a neutral voltage to said substrate.

4. A semiconductor device in accordance with claim 1 wherein a high programming voltage is applied to said control gate, between about 12 Volts to about 14 Volts, an intermediate voltage to said source region, between about 3 Volts and about 5 volts to said control gate, near 0 Volts to said drain region, and between about −3 Volts and about −5 Volts to said substrate.

5. A semiconductor device in accordance with claim 2 comprising means for erasing data in said device by applying a voltage from a neutral value and about 5

Volts to said drain region, applying a floating voltage to said source region, applying a substantial negative voltage on said control gate, and applying a voltage to said substrate between about −3 Volts and about −5 Volts.

6. A semiconductor device in accordance with claim 5 wherein said negative voltage applied to said control gate is about −10 Volts.

7. A semiconductor device in accordance with claim 3 comprising means for reading data in said device by applying a voltage from a neutral value and about −1 Volts to said drain region, applying a neutral voltage of about 0 Volts to said source region, applying a positive voltage to said control gate, and a neutral voltage on said substrate.

8. A semiconductor device in accordance with claim 7 wherein said control gate voltage is between about about 3 Volts and about 5 Volts.

9. A method of operating a split gate, flash memory cell device, said device including a semiconductor substrate, a source region, a drain region, a dielectric layer deposited upon said substrate, and a floating gate electrode formed on said dielectric layer proximate to at least the edge of said drain region with said source region spaced away from said floating gate structure while in proximity thereto in accordance with a split gate arrangement, said device including additional dielectric material deposited upon the surface of said floating gate electrode, and a control gate electrode deposited upon the surface of said additional dielectric material, the improvement comprising the step of applying a high programming voltage to said control gate electrode during programming, and providing programming of said device with the drain region at a relatively low voltage, said source region at an intermediate positive voltage, said control gate at a relatively high voltage, and said substrate at a relatively negative voltage.

10. A method in accordance with claim 9 comprising erasing data in said device by applying a voltage between a neutral voltage and a positive voltage to said drain region, applying a floating voltage to said source, applying a negative voltage to said control gate and applying a neutral voltage to said substrate.

11. A method in accordance with claim 9 comprising reading data from said device by applying a small negative voltage to said drain region, applying a neutral voltage to said source region, applying a positive voltage to said control gate, and applying a neutral voltage to said substrate.

12. A method in accordance with claim 9 wherein said programming voltage having an intermediate value which ranges between about 3 Volts and about 5 Volts to said source region, between about 12 Volts and about 14 volts to said control gate, near 0 Volts to said drain region, and between about −3 Volts and about −5 Volts to said substrate.

13. A method in accordance with claim 10 comprising erasing data in said device by applying a voltage from a neutral value and about 5 Volts to said drain region, applying a floating voltage to said source region, and applying a substantial negative voltage on said control gate, and applying a voltage on said substrate between about −3 Volts and about −5 Volts.

14. A method in accordance with claim 13 wherein said voltage on said control gate is about −10 Volts.

15. A method in accordance with claim 11 comprising reading data in said device by applying a voltage from a neutral value and about −1 Volts to said drain region, a neutral voltage to said source region of about 0 Volts, a positive voltage to said control gate, and a neutral voltage on said substrate.

16. A method in accordance with claim 15 wherein said voltage on said control gate is between about 3 Volts and about 5 Volts.

17. A semiconductor flash memory device formed on a substrate lightly doped with a dopant, a source region and a drain region in said substrate on the surface thereof, a dielectric layer deposited upon said substrate, a floating gate electrode formed on said dielectric layer proximate to at least the edge said drain region with said source region spaced away from said floating gate structure in a split gate arrangement, additional dielectric material formed upon the surface of said floating gate electrode, and a control gate electrode deposited upon the surface of said additional dielectric material, and high voltage generator means for applying a programming voltage to said control gate electrode, wherein the voltages applied to elements of said device for programming, erasure and reading are substantially within the ranges as follows:

|  | Drain | Source | Control gate | Substrate |
|---|---|---|---|---|
| Program | 0 V | 3~5 V | 12~14 V | −3~−5 V |
| Erase | 0~5 V | Floating | ~−10 V | 0 V |
| Read | ~1 V | 0 V | 3~5 V | 0 V |

18. A method in accordance with claim 9 wherein voltages applied to elements of said device for programming, erasure and reading are substantially within the ranges as follows:

|  | Drain | Source | Control gate | Substrate |
|---|---|---|---|---|
| Program | 0 V | 3~5 V | 12~14 V | −3~−5 V |
| Erase | 0~5 V | Floating | ~−10 V | 0 V |
| Read | ~1 V | 0 V | 3~5 V | 0 V | said device comprising a flash memory cell.

* * * * *